United States Patent
Razafimandimby

(10) Patent No.: US 8,493,155 B2
(45) Date of Patent: Jul. 23, 2013

(54) MULTIBAND VOLTAGE CONTROLLED OSCILLATOR WITHOUT SWITCHED CAPACITOR

(75) Inventor: Stephane Razafimandimby, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 43 days.

(21) Appl. No.: 13/176,893

(22) Filed: Jul. 6, 2011

(65) Prior Publication Data

US 2012/0007686 A1 Jan. 12, 2012

(30) Foreign Application Priority Data

Jul. 6, 2010 (FR) ...................................... 10 02850

(51) Int. Cl.
*H03B 5/12* (2006.01)
*H03K 3/282* (2006.01)
*H03K 3/354* (2006.01)

(52) U.S. Cl.
USPC ................ 331/36 C; 331/117 R; 331/117 FE

(58) Field of Classification Search
USPC ......................................... 331/117 R, 117 FE
See application file for complete search history.

(56) References Cited

U.S. PATENT DOCUMENTS

| 4,881,042 | A  | * | 11/1989 | Min et al. ...................... 329/326 |
| 7,012,472 | B2 | * | 3/2006 | Xu et al. .......................... 331/16 |
| 7,671,689 | B2 | * | 3/2010 | Deng et al. .................... 331/167 |
| 2004/0130369 | A1 | * | 7/2004 | Hong et al. ..................... 327/215 |
| 2007/0176703 | A1 |   | 8/2007 | Li et al. ............................ 331/167 |
| 2008/0164955 | A1 |   | 7/2008 | Pfeiffer et al. ............. 331/117 R |
| 2011/0254632 | A1 | * | 10/2011 | Sawada ........................... 331/10 |

FOREIGN PATENT DOCUMENTS

| WO | 2009/054760 | 4/2009 |
| WO | 2009/145686 | 12/2009 |

OTHER PUBLICATIONS

Jimenez et al, "A 56GHz LC-Tank VCO with 17% Tuning Range in 65nm Bulk CMOS for Wireless HDMI Applications", RFIC, IEEE, 2009, pp. 481-484.

* cited by examiner

*Primary Examiner* — Ryan Johnson
*Assistant Examiner* — Christian L Rivera
(74) *Attorney, Agent, or Firm* — Allen, Dyer, Doppelt, Milbrath & Gilchrist, P.A.

(57) ABSTRACT

A controlled oscillator includes, connected in parallel, a capacitor configured to be tuneable based upon a first signal, an inductor, and an active impedance. The active impedance is formed by a pair of cross-coupled transistors connected so as to produce a negative resistive component at the terminals of the active impedance. Circuitry produces a degeneracy tuneable by a second signal in the cross-coupled pair, such that the cross-coupled pair produces a capacitive component tuneable based upon the second signal at the terminals of the active impedance.

12 Claims, 4 Drawing Sheets

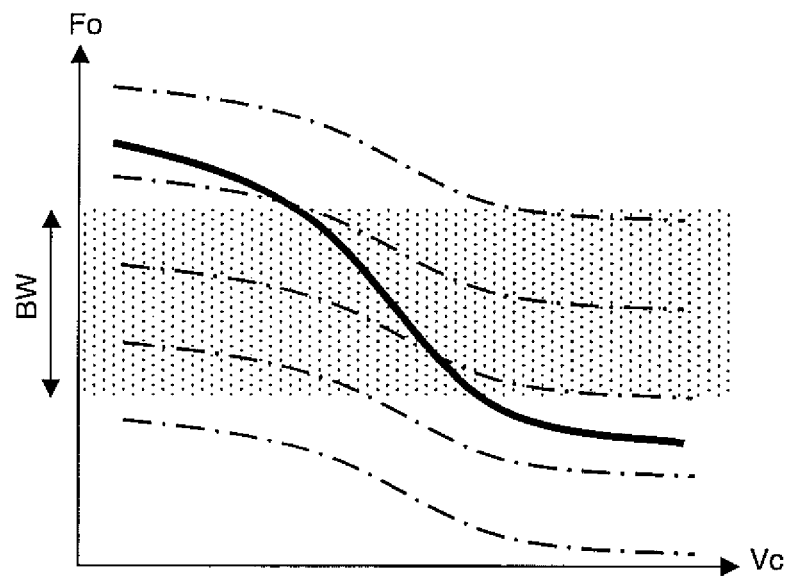
Fig 3
(PRIOR ART)
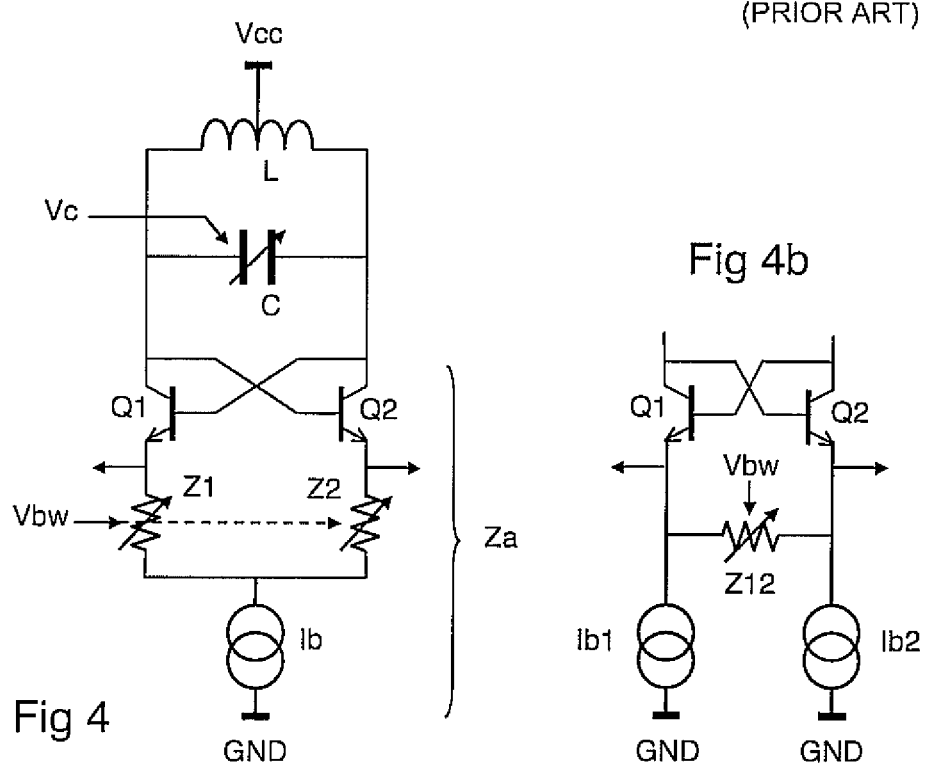
Fig 4
Fig 4b

MULTIBAND VOLTAGE CONTROLLED OSCILLATOR WITHOUT SWITCHED CAPACITOR

FIELD OF THE INVENTION

The invention relates to an oscillator with a frequency tunable by bands that is able to operate at frequencies of up to tens of gigahertz.

BACKGROUND OF THE INVENTION

FIG. 1 schematically represents a conventional application of a voltage controlled oscillator. A phase locked loop (PLL) serves the purpose of demodulating signals or of synthesizing frequencies. The voltage controlled oscillator VCO produces a frequency Fo determined by a control voltage Vc. Voltage Vc is generated by a phase-frequency comparator PFD associated with a charge pump and a low-pass filter LPASS. The phase-frequency comparator compares the frequency Fo, divided beforehand by N by a frequency divider DIV-N, with a reference frequency Fref, whereas the charge pump supplies a current proportional to the phase difference between a set point and the divided output. This current is integrated via a filter supplying a mean frequency correction voltage value to reach the setpoint. The loop then acts on oscillator VCO so that the frequency Fo tends to N·Fref.

FIG. 2 schematically represents a conventional voltage controlled oscillator called cross-coupled transistor pair oscillator. An "energy tank" comprises an inductor L and a variable capacitor or "varactor" C in parallel. An active impedance Za is connected to the terminals of the energy tank. The oscillator output signal, a differential signal, is taken at the terminals of energy tank LC.

In this example, inductor L comprises a mid-point connected to a high supply line Vcc. The capacitance of varactor C is tunable around a nominal value by a control voltage Vc. A stray resistor Rp is shown connected in parallel with tank LC.

The role of active impedance Za is to produce a negative resistive component at the terminals of energy tank LC tending to compensate the effect of stray resistor Rp so as to maintain oscillation at the resonance frequency of tank LC.

Active impedance Za comprises a pair of cross-connected MOS transistors M1 and M2 whose drains form the respective terminals of the active impedance. The gates of transistors M1 and M2 are respectively connected to the drains of transistors M2 and M1. The sources of transistors M1 and M2 are connected to a reference voltage line GND by a common current source Ib.

One difficulty encountered in the use of this type of oscillator is matching its frequency tuning range to the required applications. For example, in a PLL, the frequency tuning range corresponds to the PLL capture range, which should be as broad as possible. It is on the other hand also desirable for the oscillator tuning slope (noted KVCO), expressed in Hz/V, not to be too steep in order to reduce the sensitivity of the PLL, in particular to noise.

FIG. 3 is a graph of the frequency Fo versus the control voltage Vc of a voltage controlled oscillator, illustrating a conventional approach used to attempt to satisfy these contradictory requirements. The desired bandwidth BW is represented by the grey zone. The oscillator frequency should scan this whole band, with a tolerance margin at each end to compensate for dispersions of the characteristics of the components (due to imperfections of the manufacturing processes and to thermal effects).

The characteristic of an oscillator with a "large swing" varactor, allowing the oscillator to scan the full required range, has been represented by a bold line. In some applications, the oscillator tuning slope may prove to be too steep making it too sensitive to noise.

A series of characteristics corresponding to an oscillator with a moderate swing varactor has been represented by dashed lines. A series of switched capacitors are piggybacked on the varactor, the capacitors being progressively connected in parallel on the varactor by a control circuit as the oscillator frequency is reduced. Several adjacent tuning ranges or bands are thus created, each with a moderate slope, enhancing the noise immunity of the oscillator.

This may become difficult to implement when the oscillator is to be used at frequencies of several tens of gigahertz, as used in millimetric wave communications (for example 60 GHz for the HDMI wireless standards or 77 GHz for automobile radars). Indeed, each switched capacitor introduces a stray capacitance tending to reduce the oscillation frequency. Furthermore, the sizes of the required switched capacitors are so small that it is difficult to control their values with sufficient accuracy, in particular to ensure that the tuning ranges overlap and cover the full desired spectrum.

SUMMARY OF THE INVENTION

There is thus a need for a controlled oscillator that enables reliable tuning over a wide band, at frequencies of several tens of gigahertz. It is also desired that the oscillator be of simple structure.

These aims are met by a controlled oscillator comprising, in parallel, a capacitor tuneable by a first signal, an inductance, and an active impedance formed by a pair of crossed transistors, arranged to produce a negative resistive component at the terminals of the active impedance. The oscillator further comprises means or circuitry for introducing into the crossed pair a degeneracy tunable by a second signal, resulting in the crossed pair producing a capacitive component tunable by the second signal at the terminals of the active impedance.

According to one embodiment, the means or circuitry for introducing a tunable degeneracy comprise an adjustable impedance with a resistive predominance arranged between each transistor of the crossed pair and a bias current source common to the transistors of the pair.

According to an alternative embodiment, each transistor is biased by a respective current source, and the means or circuitry for introducing a tunable degeneracy comprise an adjustable impedance with a resistive predominance connecting the connection terminals between the transistors and their current sources.

According to one embodiment, the adjustable impedances may be formed by respective MOS transistors whose gates receive the second tuning signal. According to one embodiment, in operation, the MOS transistors may operate in a linear or resistive mode.

According to one embodiment, the oscillator output may be taken on the connections between the adjustable impedances and the transistors. According to one embodiment, in operation, the second tuning signal may vary in plateaus.

BRIEF DESCRIPTION OF THE DRAWINGS

Other advantages and features will become more clearly apparent from the following description of particular embodiments of the invention provided for exemplary purposes only and represented in the appended drawings, in which:

FIG. 3, previously described, is a graph representing an oscillation frequency band covered by several tuning ranges of an oscillator of the type of FIG. 2;

FIG. 4 represents a generic embodiment of a controlled oscillator enabling accurate tuning over several tuning ranges at frequencies of several tens of gigahertz in accordance with the present invention;

FIG. 4b represents an alternative that is electrically equivalent to the embodiment of FIG. 4;

DETAILED DESCRIPTION OF THE PREFERRED EMBODIMENTS

Figure 1:
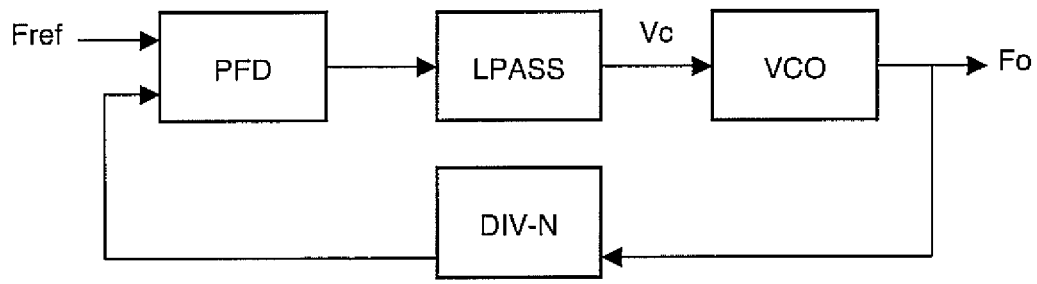
FIG. 1, previously described, illustrates a conventional phase locked loop according to the prior art.
Figure 2:
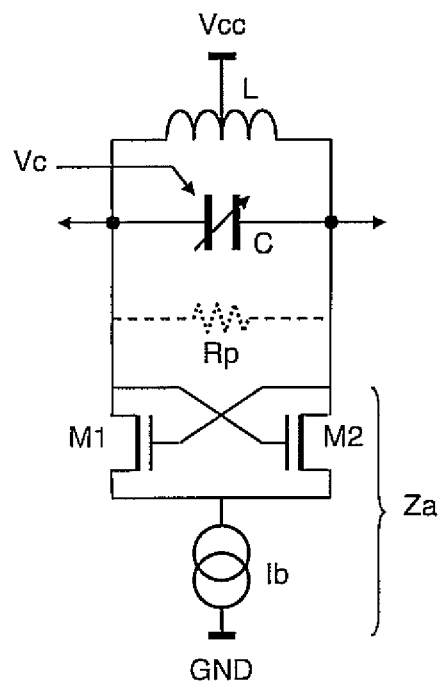
FIG. 2, previously described, schematically represents a cross-coupled transistor pair controllable oscillator according to the prior art.

FIG. 4 depicts an oscillator of the same type as that of FIG. 2, i.e. with a cross-coupled pair of transistors. Same component elements are designated by same reference numerals. Cross-coupled transistors Q1 and Q2 are here of bipolar NPN type, which are preferred for their good high frequency characteristics, their gain in particular.

Rather than providing a series of switched capacitors to be connected in parallel on varactor C to create tuning ranges, here those components produce a tuneable capacitive component through active impedance Za. This can be achieved by causing a controlled degeneracy of the pair of cross-coupled transistors Q1 and Q2. By "degeneracy", a term commonly used in the art, a gain decrease of an amplifier stage, which can be a parasite effect or, on the contrary, a desired effect, is meant. A degeneracy is equivalent to connecting an impedance, most of the time resistive, in series with the source or emitter of a gain transistor of the stage. The desired degeneracy can thus be obtained here by inserting respective, preferably resistive, impedances Z1 and Z2 at the emitters of transistors Q1 and Q2.

This degeneracy is seen, between the collectors of the transistors, i.e. at the terminals of energy tank LC, as an impedance having capacitive and resistive components. Advantage can be taken of the tunable capacitive component to add it to the capacitance of varactor C.

To make the capacitive component tunable, the values of impedances Z1 and Z2 are simply tuned by a DC voltage Vbw.

With this configuration, by making signal Vbw vary stepwise, as many tuning ranges are created as there are steps. In each range, the oscillator frequency is tuned continuously by signal Vc. The number of steps and their values are suitably chosen to create several connecting ranges that extend over the desired frequency band to reproduce the graph of FIG. 3.

Each step of signal Vbw may be determined by a continuously variable parameter, and these steps can be tuned dynamically to compensate the variations of the operating conditions of the oscillator within a PLL.

The oscillator output can be taken between the emitters of transistors Q1 and Q2. With this configuration, the oscillator output is at a low impedance, which simplifies impedance matching that may be necessary to control the circuits using the oscillator output signal.

FIG. 4b represents an equivalent electric diagram of the active impedance with tunable degeneracy of FIG. 4. The emitters of transistors Q1 and Q2 are connected to line GND by respective bias current sources Ib1 and Ib2. An impedance Z12, tunable by signal Vbw, is connected between the emitters of transistors Q1 and Q2.

Figure 5:
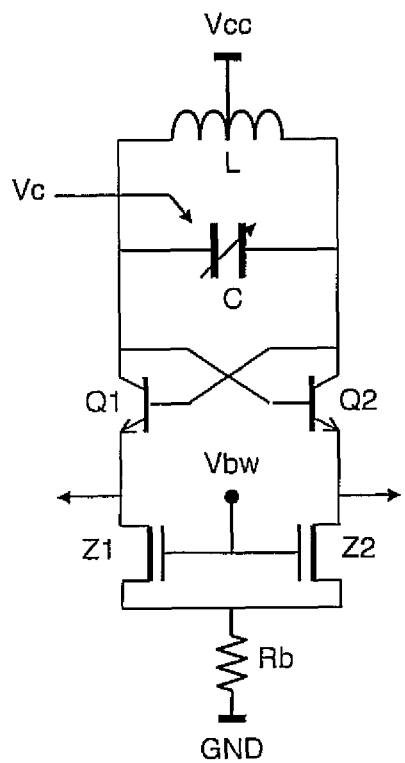
FIG. 5 represents a detailed example of the embodiment of FIG. 4.

FIG. 5 represents a practical application example derived directly from the principle diagram of FIG. 4. Each of the tuneable impedances Z1 and Z2 is formed between the drain and source of a respective N-channel MOS transistor. These MOS transistors will be referenced Z1 and Z2, like the impedances they form. The gates of MOS transistors Z1 and Z2 are controlled by a tuning voltage Vbw. The sources of transistors Z1 and Z2 are connected to line GND by a common bias resistor Rb.

For transistors Z1 and Z2 to behave as resistors that are linearly tuneable by voltage Vbw, it is preferable that they operate in their resistive or linear mode, i.e. with their operating point located in the initial portion of their drain current (Id) vs. drain-source voltage (Vds) characteristic curve, where the drain current varies substantially proportionally to the drain-source voltage. The proportionality coefficient is thus determined by gate-source voltage Vgs, itself directly dependent on voltage Vbw. The principle does however remain valid when the degeneracy transistors are used in their saturated operating mode, where the resistance no longer varies linearly. This provides a span of choices for the values of control voltage Vbw enabling an optimal coverage of the desired frequency band.

Figure 6:
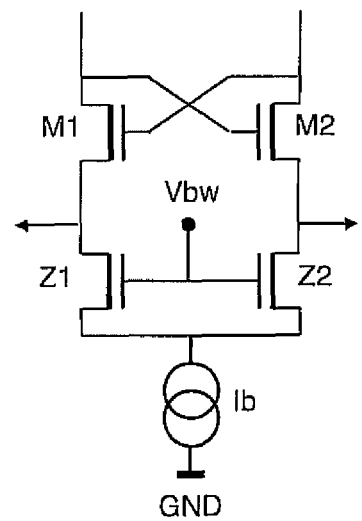
FIG. 6 represents another detailed example of the embodiment of FIG. 4.

FIG. 6 represents an alternative embodiment of the oscillator of FIG. 5 achievable in CMOS technology for lower frequencies. The cross-coupled bipolar transistors Q1 and Q2 of FIG. 5 have been replaced by respective N-channel MOS transistors M1 and M2. The sources of transistors Z1 and Z2 are connected to ground line GND by a common bias current source Ib.

Figure 7:
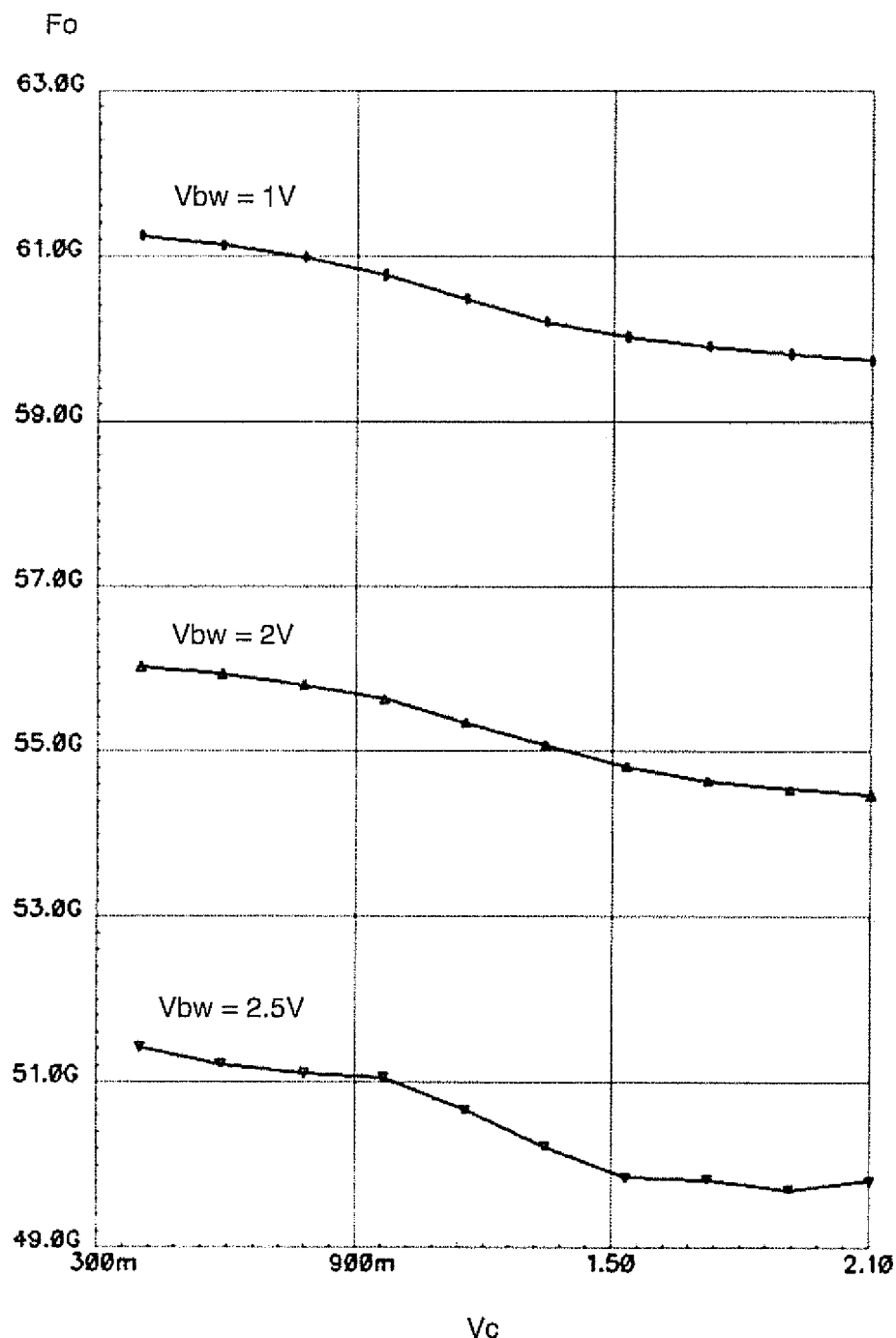
FIG. 7 is a graph illustrating an example of frequency tuning characteristics that can be obtained with the oscillator of FIG. 5.

FIG. 7 is a graph representing the behavior of the oscillator of FIG. 5 with the following parameters:
Vcc=2.5V;
Bias current: 14 mA;
L=68 pH;
C=45 fF;
Rb=150 Ohms;
MOS transistors Z1 and Z2: each composed of five five-finger elementary transistors, with W=10 μm and l=130 nm.

The graph represents in particular the variation of oscillation frequency Fo versus tuning voltage Vc of varactor C for three tuning voltage values Vbw (1V, 2V and 2.5V). The 1V and 2.5V values for Vbw correspond to the extreme values that can be obtained in an oscillator supplied with a single supply voltage of 2.5V.

The Vbw=2.5V value provides the lowest resistive degeneracy corresponding to the highest capacitive component added by active impedance Za, and therefore to the lowest frequency range. By varying tuning voltage Vc from 2.1 down to 0.5V, a frequency variation from 49.4 to 51.2 GHz is achieved.

The Vbw=1V value provides the highest resistive degeneracy corresponding to the lowest capacitive component added by active impedance Za, and therefore to the highest frequency range. By varying tuning voltage Vc from 2.1 down to 0.5V, a frequency variation from 59.4 to 66.2 GHz is achieved.

For Vbw=2V, there is an intermediate situation where the frequency range is comprised between 53.7 and 55.5 GHz.

By varying the voltage Vbw by steps between 1 and 2.5V, a band of about 11 GHz can be scanned, corresponding to 20% of the central frequency (55 GHz).

The steps of voltage Vbw are chosen such that the corresponding ranges overlap slightly or are at least contiguous. In each range, the tuning slope for voltage Vc is about 900 MHz/V, which remains moderate and enhances the noise immunity of the oscillator.

The (tuning range)/(central frequency) ratio obtained in this example, i.e. 20%, is better than that obtained in today's best performing oscillators, i.e. 17% for an oscillator described in article [A 56 GHz LC-Tank VCO with 17% Tuning Range in 65 nm Bulk CMOS for Wireless HDMI Applications, Jose Luis Gonzales Jimenez, RFIC, IEEE, 2009].

That which is claimed:

1. A controlled oscillator comprising:
    a capacitor configured to be tuneable based upon a first signal;
    an inductor coupled in parallel with said capacitor;
    an active impedance coupled in parallel with said capacitor and comprising a pair of cross-coupled transistors configured to produce a negative resistive component between terminals of the active impedance, with each transistor comprising first and second conduction terminals and with the first conduction terminal being coupled a respective terminal of said capacitor;
    a bias current source common to the pair of cross-coupled transistors;
    a pair of MOS transistors coupled between said pair of cross-coupled transistors and said bias current source, with each MOS transistor comprising a gate, a source and a drain, with the gates being controlled by a second signal such that the pair of cross-coupled produces a capacitive component tunable by the second signal between the terminals of the active impedance, with the drains being coupled to the second conduction terminals of said pair of cross-coupled transistors, and with the sources being coupled together and to said bias current source.

2. The controlled oscillator according to claim 1, wherein each MOS transistor operates in a linear mode.

3. The controlled oscillator according to claim 1, further comprising an oscillator output taken from couplings between said MOS transistors and said pair of cross-coupled transistors.

4. The controlled oscillator according to claim 1, wherein the second tuning signal varies by steps.

5. A phase locked loop (PLL) comprising:
    a phase-frequency comparator;
    a low pass filter coupled downstream of said phase-frequency comparator;
    a controlled oscillator coupled downstream of said low pass filter; and
    a frequency divider coupled to said controlled oscillator;
    said controlled oscillator comprising
        a capacitor configured to be tuneable based upon a first signal,
        an inductor coupled in parallel with said capacitor,
        an active impedance coupled in parallel with said capacitor and comprising a pair of cross-coupled transistors configured to produce a negative resistive component between terminals of the active impedance, with each transistor comprising first and second conduction terminals and with the first conduction terminal being coupled a respective terminal of said capacitor,
        a bias current source common to the pair of cross-coupled transistors, and
        a pair of MOS transistors coupled between said pair of cross-coupled transistors and said bias current source, with each MOS transistor comprising a gate, a source and a drain, with the gates being controlled by a second signal such that the pair of cross-coupled produces a capacitive component tunable by the second signal between the terminals of the active impedance, with the drains being coupled to the second conduction terminals of said pair of cross-coupled transistors, and with the sources being coupled together and to said bias current source.

6. The PLL according to claim 5, wherein each MOS transistor operates in a linear mode.

7. The PLL according to claim 5, further comprising an oscillator output taken from couplings between said MOS transistors and said pair of cross-coupled transistors.

8. The PLL according to claim 5, wherein the second tuning signal varies by steps.

9. A method of making a controlled oscillator comprising:
    configuring a capacitor to be tuneable based upon a first signal;
    coupling an inductor in parallel with the capacitor;
    coupling an active impedance in parallel with the capacitor, the active impedance comprising a pair of cross-coupled transistors configured to produce a negative resistive component between terminals of the active impedance, with each transistor comprising first and second conduction terminals and with the first conduction terminal being coupled a respective terminal of said capacitor;
    providing a bias current; and
    coupling a pair of MOS transistors between the pair of cross-coupled transistors and the bias current source, with each MOS transistor comprising a gate, a source and a drain, with the gates being controlled by a second signal such that the pair of cross-coupled produces a capacitive component tunable by the second signal between the terminals of the active impedance, with the drains being coupled to the second conduction terminals of the pair of cross-coupled transistors, and with the sources being coupled together and to the bias current source.

10. The method according to claim 9, wherein each MOS transistor operates in a linear mode.

11. The method according to claim 9, further comprising an oscillator output taken from couplings between said MOS transistors and said pair of cross-coupled transistors.

12. The method according to claim 9, wherein the second tuning signal varies by steps.

* * * * *